United States Patent [19]

Yamasita

[11] Patent Number: 5,680,074
[45] Date of Patent: Oct. 21, 1997

[54] TUBE AMPLIFIER HAVING SPECIFIC CONFIGURATION WITH FOUR TUBES

[75] Inventor: Fujio Yamasita, 105, Furora Takano, 4-14, Higashinogawa 4-chome, Komae-shi, Tokyo, Japan

[73] Assignees: Fujio Yamasita; Waco Technical Co., Ltd., both of Tokyo, Japan

[21] Appl. No.: 436,542

[22] Filed: May 8, 1995

[30] Foreign Application Priority Data

May 9, 1994 [JP] Japan ................................. 6-119639

[51] Int. Cl.$^6$ ............................................. H03F 3/52
[52] U.S. Cl. ................................... 330/70; 330/172
[58] Field of Search ........................ 330/70, 127, 168, 330/172, 181, 193

[56] References Cited

U.S. PATENT DOCUMENTS 2,529,459  11/1950  Pourciau et al. ....................... 330/70
2,810,025  10/1957  Clements ............................... 330/70

OTHER PUBLICATIONS

Tadatoku Shin, Radio Technique, pp. 157–158, IA Press Co., Ltd., Jan. 1995.
Sei Yamane, Manual for Personally Producing Tube Amplifier, pp. 108–109, Denpa–Shinbun Co., Ltd., Jun. 1978.
Mayuni Cho, Tube Amplifier Free Design, pp. 192–193, Seibundo–Shinkosha Publishing Co., Ltd., Sep. 1990.
Naoki Watanabe, All About U.S. Tube Amplifiers, pp. 64–65, Seibundo–Shinkosha Publishing Co., Ltd., Nov. 1988.
Marekatsu Matsunami, Audio Technology MJ Wireless System and Experiments, pp. 130 and 132, Seibundo–Shinkosha Publishing Co., Ltd., Jun. 1993.
Isamu Nishimura, Audio Technology MJ Wireless System and Experiments, p. 122, Seibundo–Shinkosha Publishing Co., Ltd., Jun. 1993.
Isamu Nishimura, Audio Technology MJ Wireless System and Experiments, pp. 28 and 30, Seibundo–Shinkosha Publishing Co., Ltd., Feb. 1994.
Mayo Cho, Audio Technology MJ Wireless System and Experiments, pp. 28, 30, 33 and 35, Seibundo–Shinkosha Publishing Co., Ltd., Apr. 1994.
Marekatsu Matsunami, Audio Technology MJ Wireless System and Experiments, pp. 142 and 144, Seibundo–Shinkosha Publishing Co., Ltd., Mar. 1995.

*Primary Examiner*—Steven Mottola
*Attorney, Agent, or Firm*—Lowe, Price, LeBlanc & Becker

[57] ABSTRACT

There is provided a tube amplifier comprising a first vacuum tube K3 having a plate applied with a positive voltage and a cathode applied with a negative voltage by a first resistor, a second vacuum tube K4 having a grid connected to the cathode of the first vacuum tube and a cathode or a heater applied with a voltage close to a potential of zero in relation to a plate voltage, and an output transformer TF1 having a first coil and a second coil which is connected to a loudspeaker, said first coil having a terminal connected to the plate of the second vacuum tube and another terminal applied with a positive voltage. Also, timer means is used to optimally maintain the grid voltage of the second vacuum tube when the power source is turned on, and the plate voltage of another vacuum tube K1 provided in a preceding stage of the first vacuum tube is controlled to maintain the negative voltage applied to the grid of the second vacuum tube at a desired value.

5 Claims, 3 Drawing Sheets

5,680,074

TUBE AMPLIFIER HAVING SPECIFIC CONFIGURATION WITH FOUR TUBES

BACKGROUND OF THE INVENTION

1. Field of the Invention

The present invention relates to an audio amplifier, and particularly, to a so-called tube amplifier using vacuum tubes.

2. Description of the Prior Art

Various tube amplifiers have conventionally been proposed. Most of those amplifiers use a capacitor for connecting stages to each other. Specifically, in order that a positive high voltage applied to a plate (anode) of a vacuum tube in a preceding stage is not applied to a grid of a vacuum tube in a succeeding stage, a capacitor of about 0.05 µF is inserted between the plate of the vacuum tube in the preceding stage and the grid of the succeeding stage, and a signal is transmitted from the preceding stage to the succeeding stage through the capacitor.

In addition, an amplifier using no capacitor between stages is known as a kind of direct-current amplifier or the like, but is not suitable for power-amplification of an audio signal.

SUMMARY OF THE INVENTION

In case where a capacitor is used for connecting stages with each other, there is a drawback that deformation in waveform of an audio signal occurs when the audio signal passes the capacitor, and it causes deterioration in sound quality.

Therefore, the present invention has an object of providing a tube amplifier which can amplifies the waveform of an audio signal with a high fidelity, without using a capacitor between stages.

In order to achieve the object, the present invention is arranged such that a capacitor is not used for connecting stages with each other, the cathode of a vacuum tube in a preceding stage is directly connected to the grid of a vacuum tube in a succeeding stage, and the vacuum tube in the preceding stage is connected by cathode-follower connection thereby to optimally set voltages supplied to electrodes of respective vacuum tubes.

Specifically, according to the present invention, there is provided a tube amplifier comprising:

a first vacuum tube forming a preceding stage and having a plate applied with a positive voltage and a cathode applied with a negative voltage by a first resistor;

a second vacuum tube having a grid connected to the cathode of the first vacuum tube and the cathode or a heater applied with a voltage close to a potential of zero in relation to a plate voltage; and an output transformer having a first coil and a second coil which is connected to a loud-speaker, said first coil having a terminal connected to the plate of the second vacuum tube and another terminal applied with a positive voltage.

In addition, according to the present invention, use of timer means enables optimal maintenance of a grid voltage of the second vacuum tube when the power is turned on. Further, a plate voltage of another vacuum tube provided in a preceding stage of the first vacuum tube is controlled, so that a negative voltage applied to the grid of the second vacuum tube can be maintained at a desired value.

DETAILED DESCRIPTION OF THE EMBODIMENTS

Figure 1:
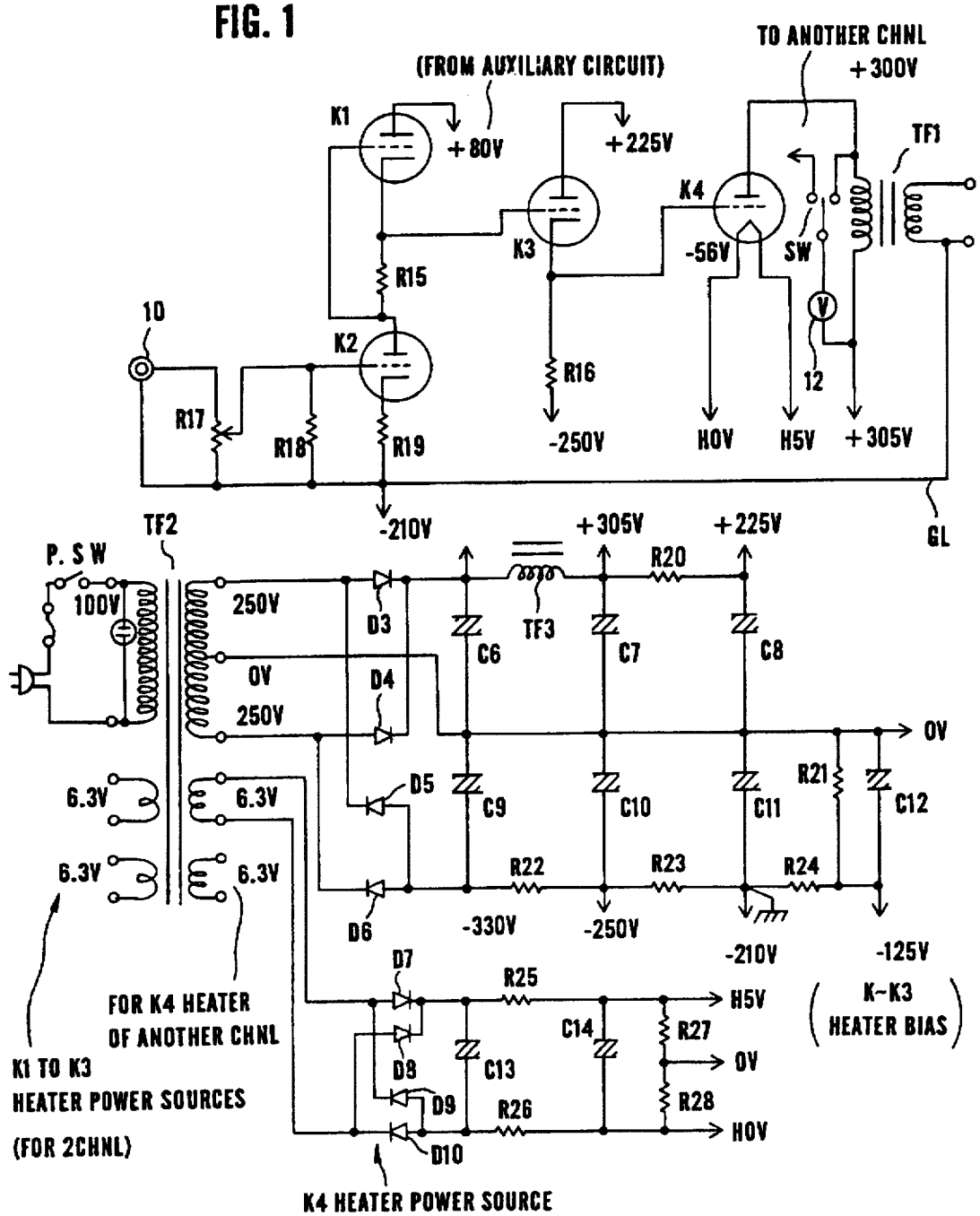
FIG. 1 is a block diagram showing a main part of a first embodiment of the tube amplifier according to the present invention.

In the following, preferred embodiments of the present invention will be explained with reference to the drawings. FIG. 1 is a wiring diagram of a preferred embodiment of a tube amplifier according to the present invention. A power source circuit is shown in a lower portion of FIG. 1, and includes a power source transformer TF2, diodes D3 to D10, electrolytic capacitors C6 to C14, a choke coil TF3, and resistors R20 to R28. A direct current power source of a voltage shown in the figure and an alternating current for a heater are supplied by this structure. Specifically, this voltage is supplied to those portions which are indicated by arrows in the amplifier and are denoted with power the same voltage values as those shown in the power source circuit.

A reference numeral 10 denotes an input terminal which is supplied with an output signal from a reproducing device such as a CD player, a tape deck, or the like. A terminal end of the input terminal 10 is connected to a terminal of a variable resistor R17, while another terminal end of the input terminal 10 is connected to a ground line GL. Also, another terminal of the variable register R17 is connected to the ground line GL. Note that the ground line GL is not set to 0V, but is applied with a negative high voltage of −210V in this embodiment, as is shown in the figure. The variable resistor R17 has a movable terminal connected to a grid of a vacuum tube K2, and this grid is connected to the ground line GL through a resistor R18. The vacuum tube K2 has a cathode connected to the ground line GL through a resistor R19, and also has a plate which is directly connected to a grid of a vacuum tube K1 and is simultaneously connected to a cathode of the tube K1 through a resistor R15. The vacuum tube K1 has a plate applied with a voltage of +80V.

The cathode of the vacuum tube K1 is directly connected to a grid of a vacuum tube K3. The vacuum tube K3 has a plate applied with a voltage of +225V, and a cathode supplied with a voltage of −250V through a resistor 16. The vacuum tube K3 has a cathode directly connected to a grid of another vacuum tube K4, and a plate connected to a terminal of a first coil of an output transformer TF1. Another terminal of the first coil of the output transformer TF1 is applied with a voltage of +305V. The vacuum tube K4 has a heater applied with a heater power voltage indicated by H0V and H5V.

Although the heater power voltage indicated by H0V and H5V stated above is a direct power source voltage of 5V, as shown in the lowermost portion of FIG. 1, registors R27 and R28 are directly connected to each other, and the middle point therebetween is connected to a line of 0V, and therefore, the heater of the vacuum tube K4 is substantially set to a voltage close to 0V, depending on a relationship with a plate voltage of the vacuum tube K4. The output transformer TF1 has a second coil connected to a loud-speaker not shown, and another terminal thereof is connected to the ground line GL.

Since the amplifier portion shown in the upper half of FIG. 1 is used for one single channel, another amplifier portion must be prepared for another channel in case of a stereo system. A voltage meter 12 is connected between both ends of the second coil of the output transformer, with a switch SW inserted therebetween. This voltage meter 12 is used to carry out a manual adjustment which will be described later, and applies a direct current voltage meter of about 10V. The switch SW is prepared to simultaneously use the voltage meter 12 for another channel in view of a stereo system.

Tubes of the following item numbers may be used for vacuum tubes K1, K2, K3, and K4.

K1, K2 . . . 12AX7
K3 . . . 6S4-A
K4 . . . 300B

Meanwhile, the resistors R15 to R19 should desirably have resistances close to the following values.

R15 . . . 1k Ω
R16 . . . 10k Ω
R17 . . . 100k Ω(VR character: A)
R18 . . . 100k Ω
R19 . . . 1k Ω

Note that the vacuum tubes K1 to K4 respectively correspond to the first to fourth vacuum tubes described in the claims, as follows. Cited current values denote preferred values of plates.

First vacuum tube . . . K3 (19.5 mA)
Second vacuum tube . . . K4 (60 mA)
Third vacuum tube . . . K1 (1 mA)
Fourth vacuum tube . . . K2 (1 mA)

Figure 2:
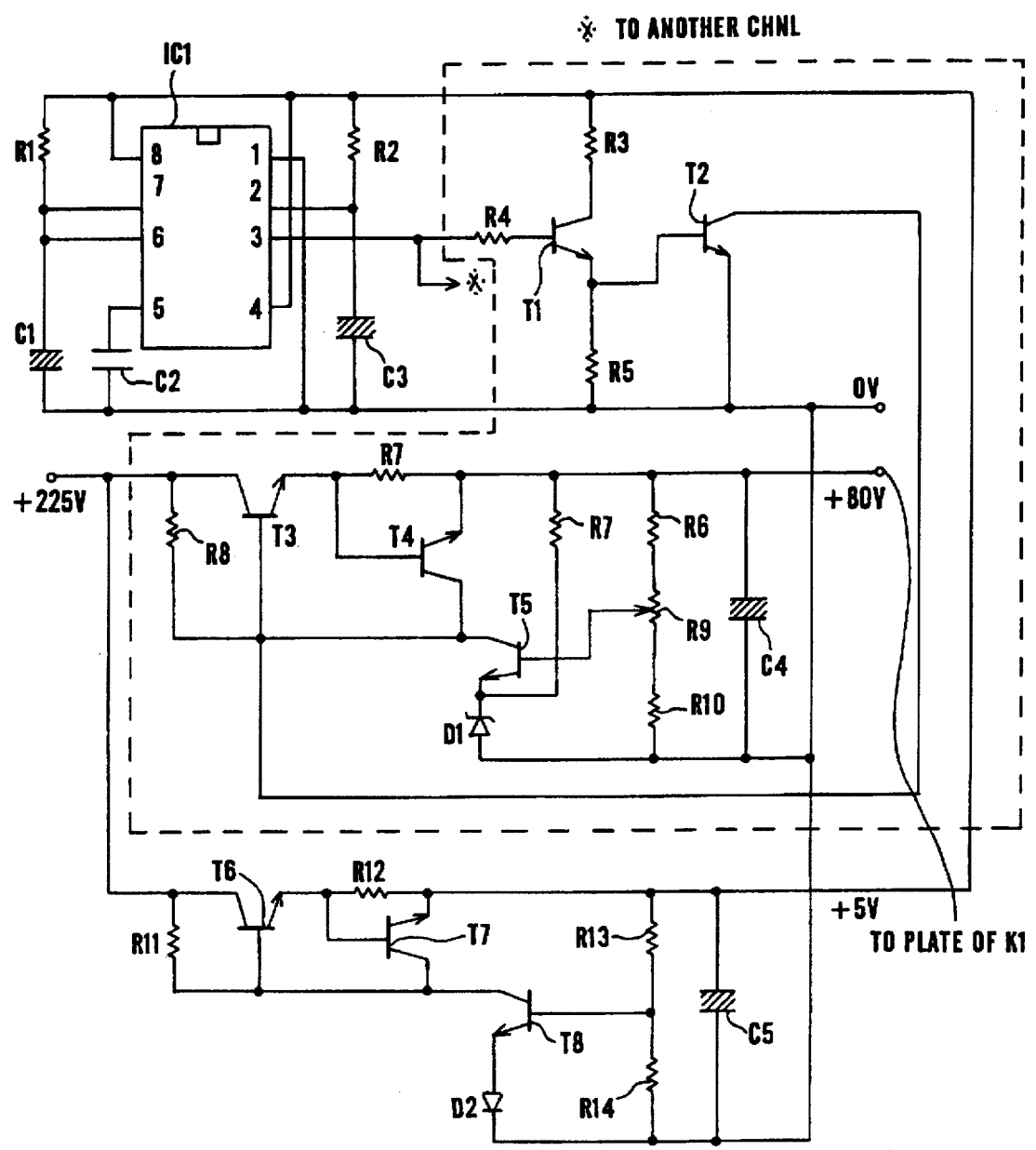
FIG. 2 is a block diagram showing an auxiliary circuit portion of the first embodiment shown in FIG. 1.

In the following, an auxiliary circuit shown in FIG. 2 will be explained. This auxiliary circuit has an integrated circuit IC1 for a timer, which functions as a timer circuit and also serves to manually adjust the plate voltage of the vacuum tube K1. In FIG. 2, references R1 to R14 denote resistors, C1 to C5 denote capacitors, T1 to T8 denote transistors, and references D1 to D2 respectively denote a zener diode and a normal diode. The resistor R9 is a variable resistor. A product No. NE555 available from Toshiba Co., Ltd. may be used as the integrated circuit for a timer.

This timer circuit is supplied with a voltage of +225V from a power source circuit shown in a lower portion of FIG. 1, and serves to supply a direct current of +80V, which is to be supplied the vacuum tube K1, after a predetermined time from when the power is turned on. In addition, the output voltage of +80V can be changed within a predetermined width, by manually adjusting the variable resistor R9, and as a result, the grid voltage of the vacuum tube K4 shown in FIG. 1 can be set to a value close to −56V indicated in the figure. Further, the portion surrounded by a broken line in FIG. 2 is prepared for each channel, and this portion therefore corresponds to one channel (CHNL) in case of a stereo system, in this figure.

In the following, operations of the circuits shown in FIGS. 1 and 2 will be explained in more details. When the power switch P.SW shown in a lower portion of FIG. 1 is turned on, the power source of the heater of each vacuum tube is turned on and a plate voltage is applied to vacuum tubes K3 and K4. However, the integrated circuit IC1 for a timer operates to maintain the transistor T1 turned on until a predetermined time passes. Therefore, the transistor T2 is turned on. As a result, the transistor T3 is turned OFF, so that the voltage of the output terminal indicated as +80V is close to 0V. A time constant of the timer circuit is decided, depending on values of the resistor R1 and the capacitor C1. Where R1 is 1MΩ and C1 is 22 μF, the transistor T1 is turned on after 28 seconds from turning-on of the power source. For example, where the capacitor C1 is 10 μF, the transistor T1 is turned on after 13 seconds. Where the capacitor C1 is 33 μF, the transistor T1 is turned on after 39 seconds. Furthermore, if the resistor R1 is a variable resistor, a desired time can manually be set.

When the set time has passed, the transistors T1 and T2 are turned off, and as a result, the transistor T3 is turned on so that an output of +80V is obtained. This voltage is applied to the plate of the vacuum tube K1 shown in FIG. 1. This kind of timer circuit is provided because the vacuum tube K3 is almost cut off immediately after the power source is turned on, thereby preventing a voltage drop due to the resistor R16, so that the grid of the vacuum tube K4 has a voltage of −10V which is much higher than a desired voltage when no signals are supplied and it takes about 20 seconds to recover a regular voltage of −56V. In other words, a timer circuit is provided in order to make the vacuum tube K1 in the input stage operate after the grid of the vacuum tube K4 recovers a regular voltage of −56V.

As has been explained above, the variable resistor R9 is provided to make a manual adjustment for changing the plate voltage of the vacuum tube K1 within a range of, e.g., +50V to +100, when no signals are supplied, while monitoring the voltage meter 12 connected to the first coil of the output transformer TF1 shown in FIG. 1. This prevents the grid voltage of the vacuum tube K4 from rising or falling from a regular voltage of −56V due to manufacturing errors of the vacuum tube K4, due to replacement thereof, or due to time-dependent changes of respective parts. Specifically, the grid voltage of the vacuum tube K4 is set by adjusting the plate voltage of the vacuum tube K1.

In the above embodiment, a product of item No. 300B having no cathode is used as the vacuum tube K4. However, when a vacuum tube having a cathode is used, the cathode voltage is set to a value close to 0V. After the timer circuit is turned on, normal operation starts. The vacuum tubes K1 and K2 constitute an input amplifier stage and a signal is supplied in form of a cathode follower of the vacuum tube K1 to the vacuum tube K3 in a next stage. The vacuum tube K3 adopts the form of a cathode follower and therefore has a cathode connected to the grid of the vacuum tube K4 in further next stage. Signals thus amplified are supplied, one after another, to the vacuum tube K4 constituting a final stage, and are subjected to power-amplification in this tube K4. The signals are then supplied to a loud-speaker not shown through the output transformer TF1. The same operation as above is applicable to another channel. In addition, it is desirable to select a transformer using a permalloy core as an output transformer TF1, in view of reproduction with a high-fidelity.

Figure 3:
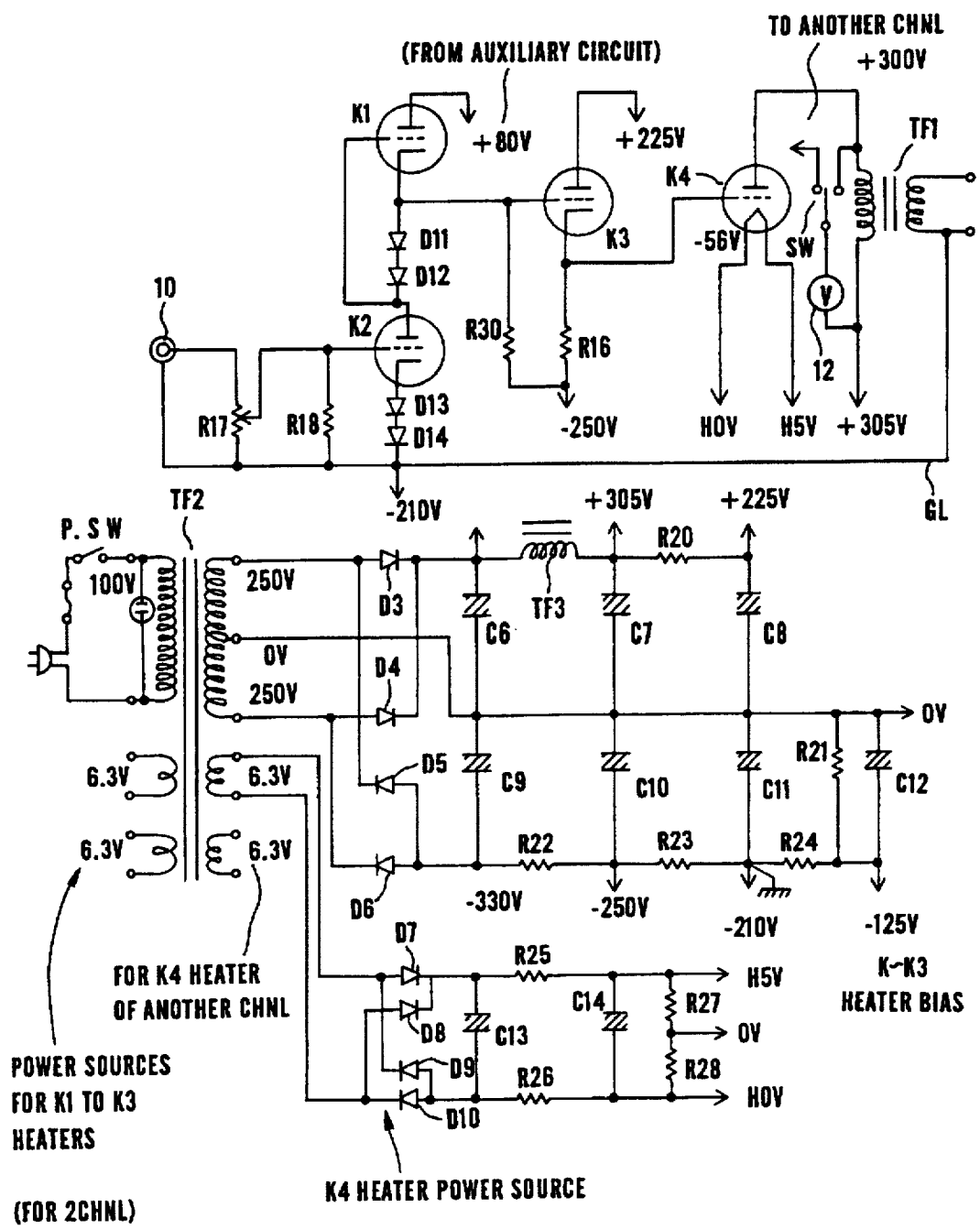
FIG. 3 is a block diagram showing a main part of a second embodiment of the tube amplifier according to the present invention.

In the following, a second embodiment of the present invention will be explained with reference to FIG. 3. The second embodiment shown in FIG. 3 is used together with the auxiliary circuit shown in FIG. 2, as in the first embodiment. Therefore, the following explanation of the second embodiment will be made only to points different from the first embodiment. Although a resistor R15 is inserted between the grid and cathode of the vacuum tube K1 of FIG. 1, this resistor is replaced with a serial circuit consisting of two diodes D11 and D12 in the second embodiment of FIG. 3. In the same way, a serial circuit consisting of diodes D13 and D14 is inserted between the grid and cathode of tube K2. Further, a resistor R30 is additionally inserted between the grid and cathode of the vacuum tube K3.

Note that the diodes D11, D12, D13, and D14 may be products of the following item No. 1S1830

Furthermore, the following resistance value is desirable for the resistor R30

R30 . . . 4.7M Ω

The resistors R15 and R19 connected to the cathodes of the vacuum tubes K1 and K2 in the first embodiment are replaced with diodes (1S1830) due to following reasons.

(1) Rising characteristic of a waveform can be improved when amplifying a square (rectangular) wave.

(2) Frequency characteristic can be improved within a range of 10 to 20 KHz.

(3) Distortion rate can be improved when an output is small.

(4) Drifting of currents passing through tubes K1 and K2 can be reduced even when the sound volume is changed by the resistor R17.

Furthermore, since a resistor R30 is connected between the grid and cathode of the vacuum tube K3, the bias voltage of the tube K3 can be maintained at a constant value, thereby preventing accidents, e.g., sequential defective operation of tubes KS and K4 or break-down of tube bulbs which may caused by transition of the bias voltage of the tube K3 due to reasons such as short-circuiting, glow-discharging or the like in the tubes.

As has been specifically described above, the tube amplifier according to the present invention comprises: a first vacuum tube forming a preceding stage and having a plate applied with a positive a voltage and a cathode applied with a negative voltage by a first resistor; a second vacuum tube having a grid connected to the cathode of the first vacuum tube and a cathode or a heater applied with a voltage close to a potential of zero, depending on a relationship with a plate voltage; and an output transformer having a first coil and a second coil which is connected to a loud-speaker, said first coil having a terminal connected to the plate of the second vacuum tube and another terminal applied with a positive voltage. Therefore, this tube amplifier achieves signal-amplification with a high fidelity, without using a capacitor for connecting stages, and the quality of reproduced sounds is excellent. In addition, two vacuum tubes are used for an input stage, and a plate voltage is applied to one (i.e., the vacuum tube K1) of the tubes by timer means, so that the vacuum tube K4 in the final stage can be protected when the power source is turned on. Further, the plate voltage of the vacuum tube K1 in the input stage can be manually controlled, and therefore, the grid voltage of the vacuum tube K4 in the final stage can be continuously set to a desired value when no signals are supplied.

What is claimed is:

1. A tube amplifier comprising:

a first vacuum tube forming a preceding stage and having a plate applied with a positive voltage and a cathode applied with a negative voltage by a first resistor;

a second vacuum tube having a grid connected to the cathode of the first vacuum tube, said second vacuum tube having a cathode or a heater applied with a voltage close to zero relative to a plate voltage thereof;

a third vacuum tube having a cathode connected to a grid of the first vacuum tube, a plate applied with a positive voltage, and a grid connected to the cathode with a resistor being inserted therebetween;

a fourth vacuum tube having a plate connected to the grid of the third vacuum tube, a grid applied with an input signal, and a cathode applied with a negative voltage through a resistor; and an output transformer having a first coil and a second coil to which is connected a loud-speaker, said first coil having a terminal connected to the plate of the second vacuum tube and another terminal applied with a positive voltage.

2. A tube amplifier according to claim 1, further comprising timer means which operates to make the positive voltage to be applied to the plate of the third vacuum tube be applied after a predetermined time period from when a power source is turned on.

3. A tube amplifier according to claim 1, further comprising means for setting the negative voltage to be applied to the grid of the second vacuum tube to a desired value, by changing the positive voltage to be applied to the plate of the third vacuum tube.

4. A tube amplifier comprising:

a first vacuum tube forming a preceding stage and having a plate applied with a positive voltage and a cathode applied with a negative voltage by a first resistor;

a second vacuum tube having a grid connected to the cathode of the first vacuum tube, said second vacuum tube having a cathode or a heater applied with a voltage close to zero relative to a plate voltage thereof;

a third vacuum tube having a cathode connected to a grid of the first vacuum tube, a plate applied with a positive voltage, and a grid connected to the cathode with a diode being inserted therebetween;

a fourth vacuum tube having a plate connected to the grid of the third vacuum tube, a grid applied with an input signal, and a cathode applied with a negative voltage through a diode; and an output transformer having a first coil and a second coil to which is connected a loud-speaker, said first coil having a terminal connected to the plate of the second vacuum tube and another terminal applied with a positive voltage.

5. A tube amplifier according to claim 2, further comprising means for setting the negative voltage to be applied to the grid of the second vacuum tube to a desired value, by changing the positive voltage to be applied to the plate of the third vacuum tube.

* * * * *

UNITED STATES PATENT AND TRADEMARK OFFICE
CERTIFICATE OF CORRECTION

PATENT NO. : 5,680,074
DATED : October 21, 1997
INVENTOR(S) : Fujio YAMASITA

It is certified that error appears in the above-identified patent and that said Letters Patent is hereby corrected as shown below:

On the title page, item [73] should read as follows:

--[73]   Asignees: Fujio Yamasita; Wako Technical Co., Ltd., both of Tokyo, Japan Signed and Sealed this Twenty-fourth Day of February, 1998

Attest:

BRUCE LEHMAN

Attesting Officer

Commissioner of Patents and Trademarks